United States Patent
Ohkawa

[19]

[11] 3,950,711

[45] Apr. 13, 1976

[54] FREQUENCY CHARACTERISTICS-CONTROLLING DEVICE

[75] Inventor: Motokazu Ohkawa, Yokohama, Japan

[73] Assignee: Tokyo Shibaura Electric Co., Ltd., Kawasaki, Japan

[22] Filed: Dec. 11, 1974

[21] Appl. No.: 531,612

[30] Foreign Application Priority Data
Dec. 14, 1973 Japan.............................. 48-138758
July 2, 1974 Japan.............................. 49-74964

[52] U.S. Cl. ................... 330/85; 330/107; 330/109
[51] Int. Cl.²......................................... H03F 1/36
[58] Field of Search ...... 330/85, 107, 109; 328/167; 331/140

[56] References Cited
UNITED STATES PATENTS
3,628,057  12/1971  Mueller.......................... 328/167 X Primary Examiner—James B. Mullins
Attorney, Agent, or Firm—Oblon, Fisher, Spivak, McClelland & Maier

[57] ABSTRACT

A frequency characteristics-controlling device which comprises an operational amplifier provided with two input terminals mutually bearing an inversion-noninversion relationship with respect to an output signal; a bridged-T circuit consisting of resistors and capacitors, the input terminal of said bridged-T circuit being connected to the inversion input terminal of said amplifier and the output terminal of said bridged-T circuit being connected to the output terminal of said amplifier; a first gain-controlling circuit connected between the common terminal of the bridged-T circuit and the noninversion input terminal of the amplifier; and a second gain-controlling circuit connected between the common terminal of the bridged-T circuit and the output terminal of the amplifier, whereby the frequency characteristics of an input signal supplied to the noninversion input terminal of the operational amplifier are controlled by the first and second gain-controlling circuits.

9 Claims, 14 Drawing Figures

FREQUENCY CHARACTERISTICS-CONTROLLING DEVICE

This invention relates to a frequency characteristics-controlling device which can control the frequency characteristics of a sound signal having a frequency lying in a specified frequency region over a broad range extending from attenuation to emphasis.

Hitherto, control of the quality of sound signals derived from sound-generating apparatus has been effected by emphasizing or attenuating the level of sound signals having a frequency lying in a specified frequency region. Emphasis of, for example, the low frequency component of a sound signal can be carried out particularly by raising a gain in the low region of frequency characteristics.

A known circuit for emphasizing or attenuating a gain in a particular frequency region is the type shown in FIG. 1. The circuit of FIG. 1 is so arranged that while an input signal supplied to the input terminal 14 is delivered from the output terminal 16 after being amplified by the transistor 15, a relative gain between input and output is emphasized or attenuated by varying, for example, the value of the resistor 13 at the particular frequency jointly defined by the inductor 11, capacitor 12 and resistor 13.

The circuit of FIG. 1 wherein the inductor 11 is used as one of the elements for defining a particular frequency has the drawbacks that said inductor 11 has a larger volume than the capacitor 12 and resistor 13; it is difficult to control said inductor 11 and another inductor so as to save both from mutual magnetic effects; and moreover difficulties are presented in causing the inductor 11, capacitor 12 and resistor 13 to vary with temperature in the same degree. Therefore, the prior art circuit arrangement of FIG. 1 has the shortcoming that it operates with low reliability.

It is accordingly the object of this invention to provide a highly reliable frequency characteristics-controlling device of simple arrangement which is capable of effectively controlling the quality of sound signals.

According to an aspect of this invention, there is provided a frequency characteristics-controlling device which comprises an operational amplifier provided with an inversion input terminal and a noninversion input terminal; a bridged-T circuit consisting of a first resistor connected between the inversion input terminal and output terminal of the operational amplifier, a series circuit formed of first and second capacitors and connected in parallel to the first resistor, and a second resistor, one end of which is connected to the junction of the first and second capacitors, and a gain-controlling circuit connected either between the other end of the second resistor and the noninversion input terminal or between said other end of the second resistor and the output terminal of the operational amplifier.

This invention can be more fully understood from the following detailed description when taken in conjunction with the accompanying drawings, in which.

Figure 3:
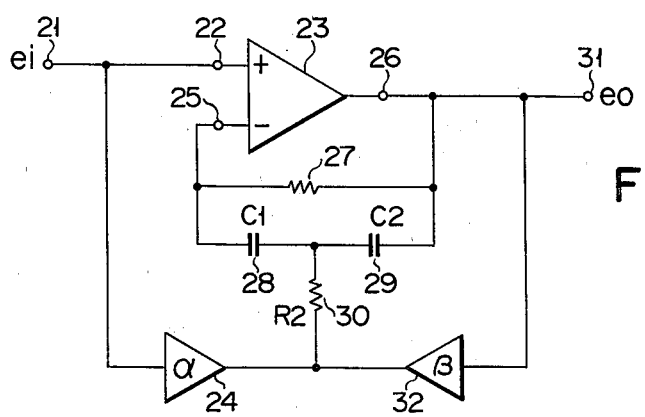
FIG. 3 is a circuit arrangement according gain-controlling an embodiment of the invention.
Figure 5:
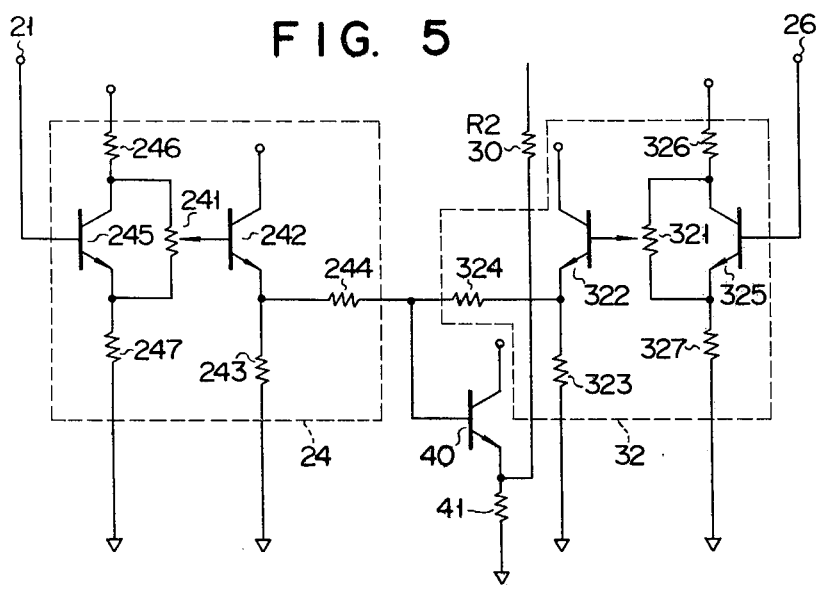
Figure 6:
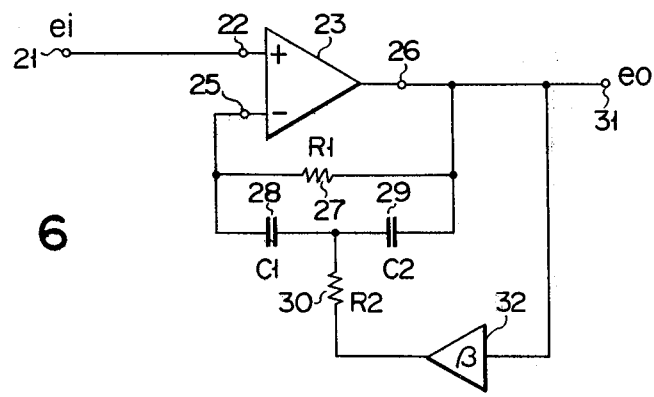
Figure 7:
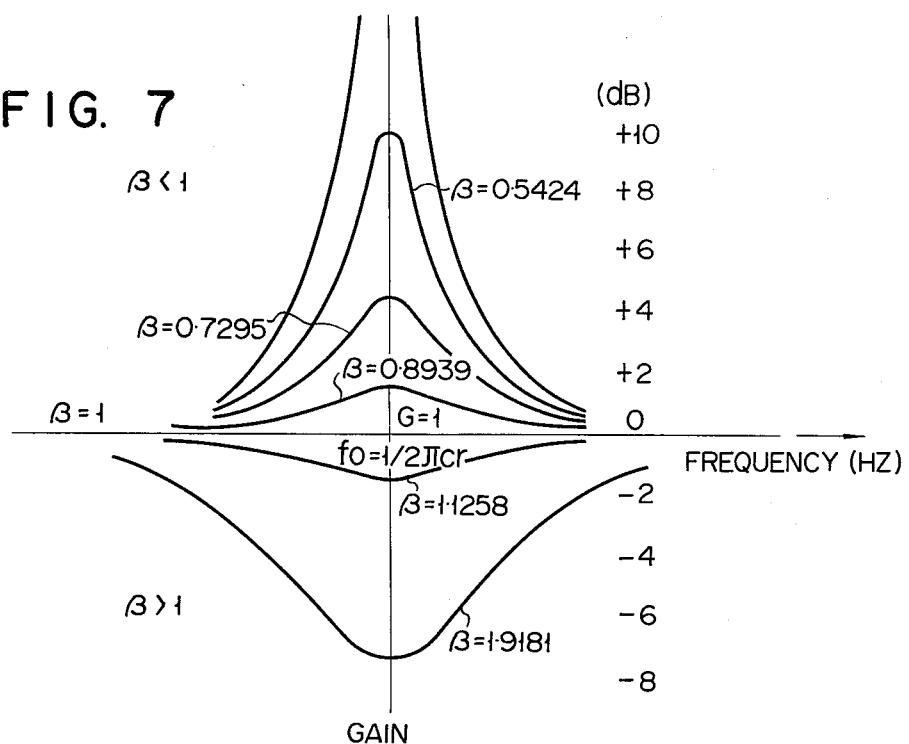
Figure 9:
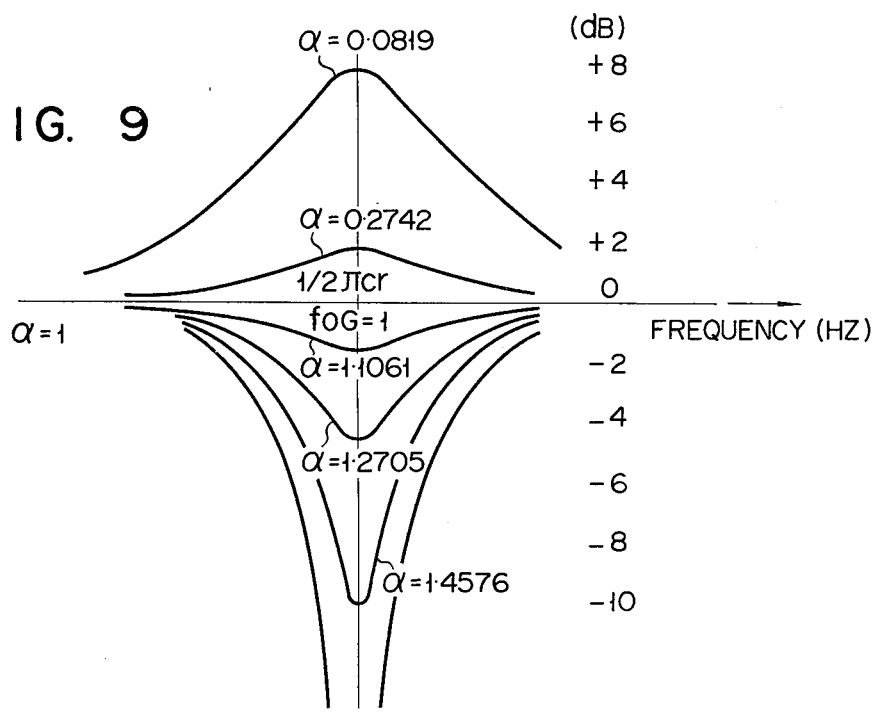
Figure 8:
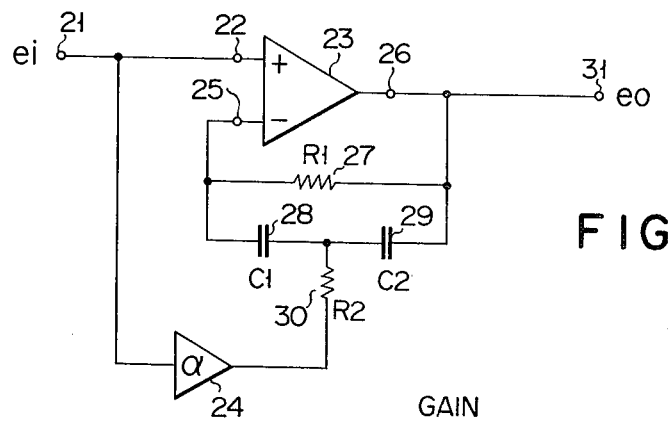
Figure 10:
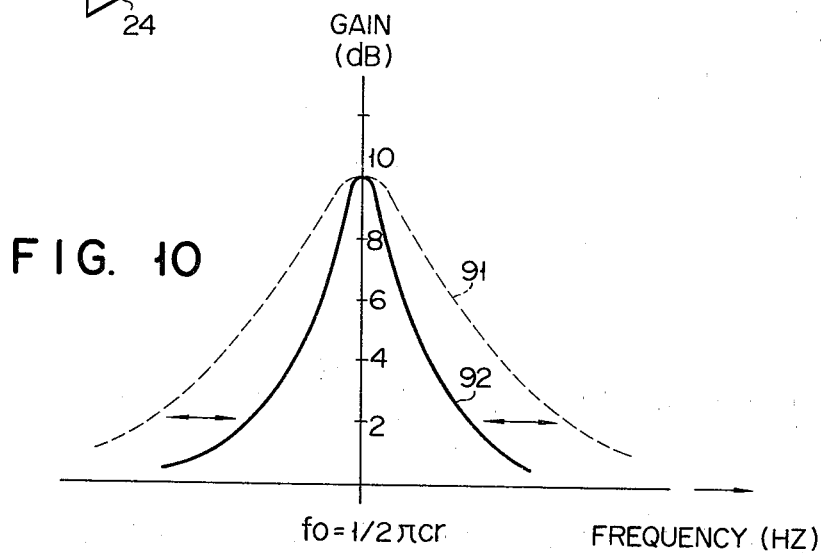
Figure 11:
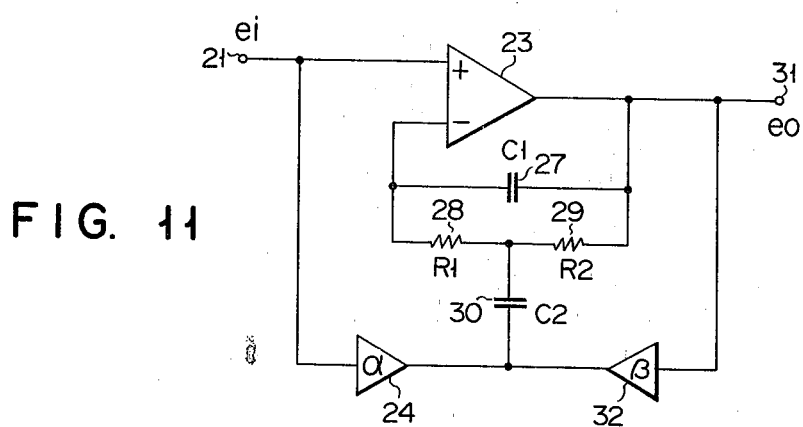
Figure 12:
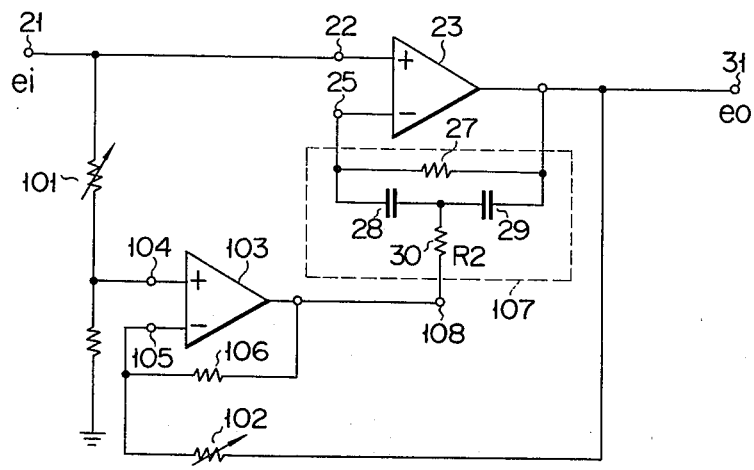
Figure 13:
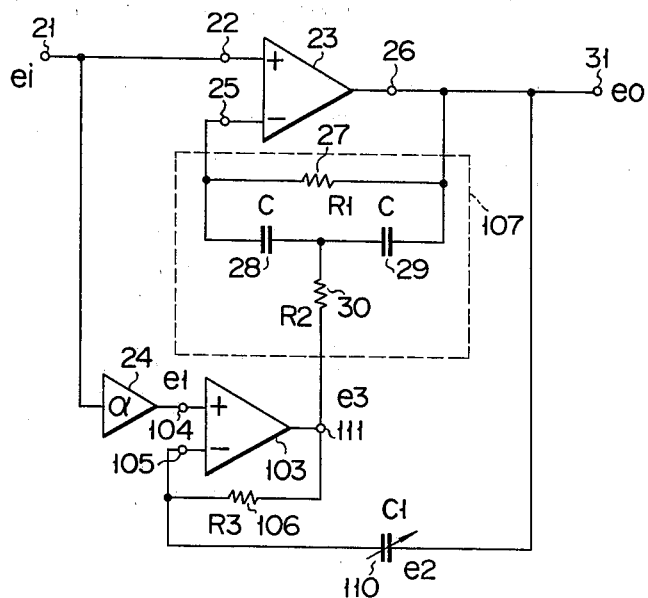
Figure 14:
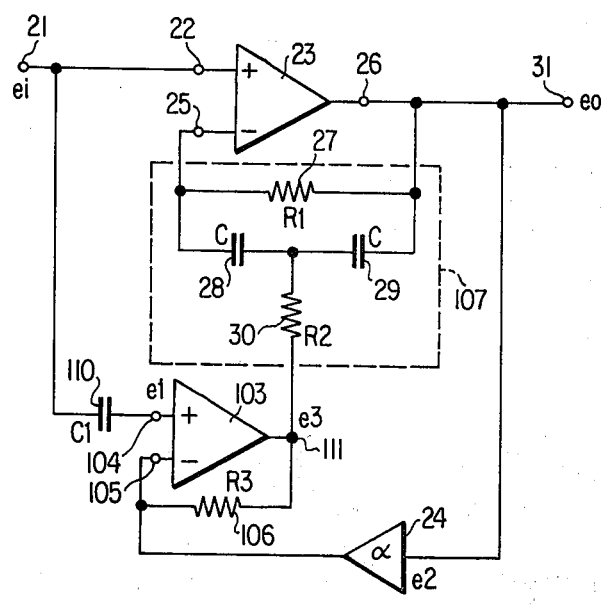

FIG. 5 indicates the concrete arrangement of another gain-controlling circuit;

FIG. 6 is a circuit arrangement omitting a gain-controlling circuit 24 included in FIG. 3;

FIG. 7 is a curve diagram illustrating the operation of the circuit of FIG. 6;

FIG. 8 is a circuit arrangement omitting a gain-controlling circuit 32 included in FIG. 3;

FIG. 9 is a curve diagram illustrating the operation of the circuit of FIG. 8;

FIG. 10 is a curve diagram illustrating the operation of the circuit of FIG. 3;

FIG. 11 shows a circuit arrangement of a frequency characteristics-controlling device according to another embodiment of the invention;

FIG. 12 indicates a circuit arrangement of a frequency characteristics-controlling device according to still another embodiment of the invention;

FIG. 13 presents a circuit arrangement of a frequency characteristics-controlling device according to a further embodiment of the invention; and FIG. 14 presents a circuit arrangement of a frequency characteristics-controlling device according to a further embodiment of the invention.

Figure 1:
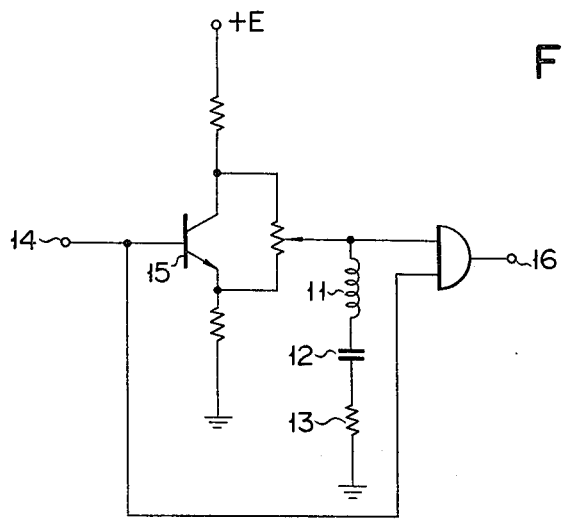
FIG. 1 is a circuit arrangement of a prior art frequency characteristics-controlling device.
Figure 2:
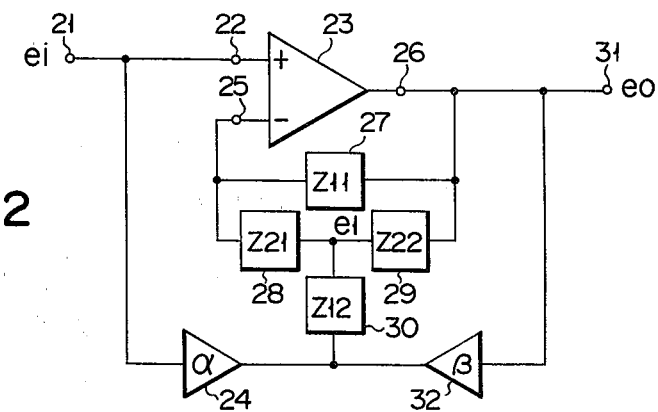
FIG. 2 is a block circuit arrangement illustrating the principle of a frequency characteristics-controlling device of this invention.

Referring to FIG. 2, the input terminal supplied with a sound signal is connected to the noninversion input terminal 22 of an operational amplifier 23 and the input terminal of the gain-controlling circuit 24. A first impedance element 27 is connected between the inversion input terminal 25 and output terminal 26 of the operational amplifier 23. A series circuit consisting of second and third impedance elements 28, 29 is connected in parallel to said first impedance element 27. The junction of the impedance elements 28, 29 is connected to one end of a fourth impedance element 30. The output terminal 26 of the operational amplifier 23 is connected to the output terminal 31 of the frequency characteristics-controlling device of this invention and the input terminal of a gain-controlling circuit 32. The output terminals of the gain-controlling circuits 24, 32 are jointly connected to the other end of the fourth impedance element 30. The impedance elements 27 to 30 collectively define a bridged-T circuit. Now, let gains derived from the gain-controlling circuits 24, 32 be designated as $\alpha$, $\beta$ respectively and the impedances of the elements 27 to 30 as $Z11, Z21, Z22, Z12$ respectively.

Further, let it be assumed that the gain-controlling circuit 24 has a fully large input impedance and that a sufficiently large gain $\alpha$ is obtained over an input signal. Then the following equation results, with the potential at the junction of the impedances $Z21, Z22$ denoted by $el$, the input potential at the input terminal 21 by $ei$ and the output potential at the output terminal 31 by $eo$.

$$\frac{eo - ei}{Z11} = \frac{ei - el}{Z21} = \frac{el - eo}{Z22} = \frac{el - ei - \beta eo}{Z12} \quad (1)$$

An overall gain G on output voltage $eo$ over input voltage $ei$ across the input terminal 21 and the output terminal 31 may be determined from the above equation (1) as follows:

$$G = \frac{\{Z11Z12 + Z22Z12 + Z21\ Z22 + Z21Z12 + Z11Z22(1-\alpha)\}}{(Z11Z12 + Z22Z12 + Z21Z12 + Z21Z12 + Z11Z22\beta)}$$

Further, let it be assumed that as shown in FIG. 3, the impedances $Z_{11}$, $Z_{12}$ of the impedance elements 27, 30 consist of resistances $R_1$, $R_2$, and the impedances of the impedance elements 28, 29 are formed of capacitances $C_1$, $C_2$. Then the impedances of the respective impedance elements 27 to 30 may be indicated as follows:

$$Z_{11} = R_1$$
$$Z_{12} = R_2$$

$$Z_{21} = \frac{1}{j\omega C_1}$$

$$Z_{22} = \frac{1}{j\omega C_2}$$

$$G = \frac{1-\omega^2 C_1 C_2 R_2 + j\omega\{(C_1+C_2)R_2+(1-\alpha)C_1R_1\}}{1-\omega^2 C_1 C_2 R_1 R_2 + j\omega\{(C_1+C_2)R_2+\beta C_1 R_1\}} \quad (3)$$

With $\alpha + \beta \neq 1$, the frequency at which an output signal obtains a maximum or minimum gain over an input signal may be determined as follows:

$$\omega = \frac{1}{\sqrt{C_1 C_2 R_1 R_2}} \quad (4)$$

An overall gain at this frequency is $$G = \frac{(C_1+C_2)R_2 + (1-\alpha)C_1R_1}{(C_1+C_2)R_2 + \beta C_1 R_1} \quad (5)$$

From the equation (3), therefore, is derived the following:

In case of $\omega \approx 0$ : $G = 1$
In case of $\omega >> \omega$: $G = 1$

Thus an overall gain of $G=1$ is obtained in the ultralow and ultrahigh frequency regions. Namely, the circuit arrangement of FIG. 3 is shown to act as an amplifier capable of providing uniform frequency characteristics throughout the low and high frequency regions. As apparent from the above equation (5), an overall gain G varies with $\alpha$ and/or $\beta$, and the resultant overall gain G assumes a maximum or minimum value at the frequency derived from the above equation (4).

Thus, the overall gain G obtained will have the following values as determined from the above equation (5):

In case of $1 - \alpha > \beta$ : a maximum value
In case of $1 - \alpha = \beta$ : 1
In case of $1 - \alpha < \beta$ : a minimum value In case of $\omega=1/\sqrt{C_1 C_2 R_1 R_2}$, the quality Q of the circuit of FIG. 3 may be expressed as follows:

$$Q = \frac{1}{\sqrt{C_1 C_2 R_1 R_2}} \cdot \frac{(1-\alpha-\beta)C_1^2 C_2 R_1^2 R_2}{\{(C_1+C_2)R_2 + (1-\alpha)C_1 R_1\}\{(C_1+C_2)+\beta C_1 R_1\}} \quad (6)$$

When, therefore, the input terminal 21 of the frequency characteristics-controlling device of FIG. 3 is supplied with sound signals, the frequencies of which extend over a broad range, and various changes are made in the ratio which a gain $\alpha$ derived from the gain-controlling circuit 24 bears to a gain $\beta$ obtained from the gain-controlling circuit 32, then an overall gain G at a particular frequency $\omega$ defined by the resistance and capacitance of the impedance elements 27 to 30 can be varied over a broad range from the state of attenuation (a minimum value) to that of emphasis (a maximum value).

Figure 4:
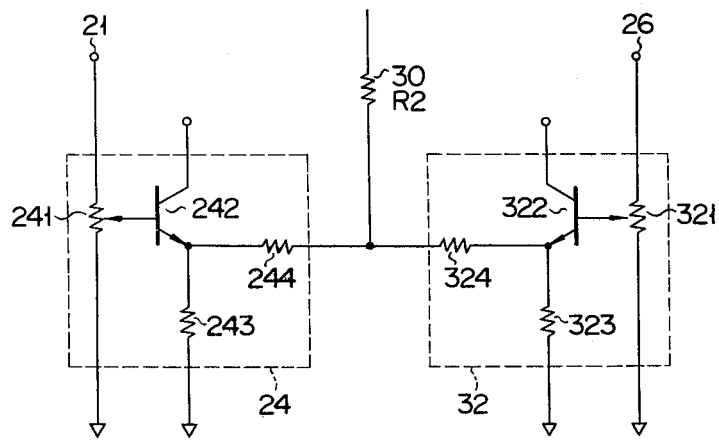
FIG. 4 shows the concrete arrangement of a gaincontrolling circuit included in FIG. 3.

There will now be described by reference to FIGS. 4 and 5 the concrete arrangement of the gain-controlling circuits 24, 32 included in the frequency-characteristics controlling device of FIG. 3. Referring to FIG. 4, input to the gain-controlling circuit 24 is supplied from the input terminal 21 through a variable resistor 241 to the base of a transistor 242. Output from said gain-controlling circuit 24 is delivered from the junction of the emitter of the transistor 242 and emitter resistor 243 through a resistor 244 to the resistor 30 of the bridged-T circuit. A gain $\alpha$ derived from the gain-controlling circuit 24 can be controlled by varying the resistance of the variable resistor 241. Input to the gain-controlling circuit 32 is conducted from the output terminal 26 of the operational amplifier 23 through a variable register 321 to the base of a transistor 322. Output from the gain-controlling circuit 32 is supplied from the junction of the emitter of the transistor 322 and emitter resistor 323 through a resistor 324 to the resistor 30 of the bridged-T circuit. A gain $\beta$ obtained from the gain-controlling circuit 32 can be controlled by varying the resistance of the variable resistor 321.

The parts of FIG. 5 the same as those of FIG. 4 are denoted by the same numerals. The gain-controlling circuit 24 of FIG. 5 has an amplifier consisting of a transistor 245 and resistors 246, 247 and positioned between the input terminal 21 and the transistor 242. An input signal is supplied to the base of the transistor 245, and after amplified by the transistor 245, conducted to both ends of a variable resistor 241. Similarly in the gain-controlling circuit 32, output from the operational amplifier 23 is conducted from the output terminal 26 to the base of a transistor 325, and then to both ends of the variable resistor 321 after amplified by an amplifier constituted by the transistor 325 and resistors 326, 327. Outputs from the gain-controlling circuits 24, 32 are supplied to the base of the transistor 40 for amplification, drawn out from the junction of the emitter of said transistor 40 and emitter resistor 41 and then conducted to the resistor 30. Also in the case of FIG. 5, gains $\alpha$, $\beta$ can be controlled by varying the resistances of the variable resistors 241, 321 respectively.

There will now be described with reference to FIGS. 6 to 9 the operation of the frequency characteristics-controlling device of FIG. 3 simply by varying only one of the two gains $\alpha$, $\beta$ for better understanding of this invention, before said operation is further detailed.

FIG. 6 shows a modification of the circuit of FIG. 3 which is used to change only a gain $\beta$ derived from the gain-controlling circuit 32 with a gain $\alpha$ taken to be zero. In this case, the resistances $R_1$, $R_2$ of the impedance elements 27, 30 of the bridged-T circuit of FIG. 6 are set at R1 = r/K and R2 = Kr respectively, and the capacitances C1, C2 of the impedance elements 28, 29 of said bridged-T circuit are set at C1 = C2 = C. Where the gain β is varied in case of r = 53 kΩ, C = 1000 PF and $$K = \frac{R2}{R1} = 0.578,$$

then the frequency characteristics of FIG. 7 are obtained with respect to a particular frequency $f_0$. This frequency $f_0$ may be expressed as follows from the equation (4):

$$f_0 = \frac{1}{2\pi Cr}$$

Referring to FIG. 7, in case of β=1, an overall gain has a value of G=1, providing uniform frequency characteristics. In case of β > 1, an overall gain G has a negative value, namely, attenuated output is obtained at the particular frequency $f_0$. In case of β < 1, an overall gain G progressively increases as a gain β decreases, finally to be brought to an emphasized state. Thus an overall gain G can be varied over a broad range from attenuation to emphasis by varying a gain β with a gain α taken as zero. Obviously, the particular frequency $f_0$ defined by the circuit of FIG. 6 can be made easily to vary with C and r.

The quality Q of the circuit of FIG. 6 can be determined from the equation (6). Where, in the equation (6), C1 = C2 = C, R1 = r/K and R2 = Kr are substituted and both numerator and denominator of said equation (6) are divided by R1², then there results the following equation (7):

$$Q = \frac{1}{Cr} \cdot \frac{(1-\alpha-\beta)C^3 Kr}{\{2CK^2 r + (1-\alpha)CK/r\}\{2CK^2 r + \beta CK/r\}} \quad (7)$$

Since Q varies with K denoting the ratio of resistance R1 to resistance R2, but not with α or β, it is possible to obtain a frequency characteristics-controlling circuit having a desired quality Q without changing the particular frequency $f_0$.

Where gains α, β are set at the following values $$\alpha = 0$$

$$\beta = \frac{-(C1 + C2)R2}{C1R1}$$

then G=∞ and in consequence Q=∞, bringing the frequency characteristics-controlling circuit of FIG. 6 to an oscillating state. In case of α=0, and β > 1, then G < 0. Thus Q has a maximum value expressed as follows.

$$Q = \frac{\sqrt{C1C2R1R2}}{\{(C1+C2)R2 + C1R1\}}$$

Namely, it is seen that where a gain β is varied with a gain α taken as zero, then Q is generally more elevated when the frequency characteristics are emphasized. The device of this invention for controlling the frequency characteristics of sound signals wherein not only the overall gain G but also Q varies, reproduces sound with a very unique effect by variation of Q.

FIG. 8 shows a modification of the circuit of FIG. 3, which is used to vary a gain α with a gain β taken as zero. The other conditions in which the circuit of FIG. 8 is operated are the same as those in FIG. 6. Where a gain α derived from the gain-controlling circuit 24 is varied in the circuit of FIG. 8, then there are obtained the attenuation and emphasis characteristics of sound signal frequency as shown in FIG. 9. For example, in case of β=0 and α=1, the resultant overall gain G has a value of 1, providing uniform frequency characteristics. In case of β=0 and α > 1, an attenuated state results. In case of β=0 and α < 1 an emphasized state is brought about. For example, where the gains α, β are set at the following values $$\beta = 0$$

$$\alpha = 1 + \frac{(C1 + C2)R2}{C1R1}$$

then G=0 and Q=∞. In case of β=0 and α < 1, then G > 0 and Q has a maximum value expressed as follows:

$$Q = \frac{\sqrt{C1C2R1R2}}{(C1 + C2)R2}$$

Since, in the circuit of FIG. 8, Q is more improved when the frequency characteristics indicate an attenuated condition, a very unique tone effect is attained by selectively attenuating very narrow frequency bands lying before and after the particular frequency $f_0$.

Since the overall gain G can be varied merely by changing only a gain α or β, it is possible for the circuit of FIG. 3 to vary frequency characteristics over a broad range from emphasis to attenuation by varying both gains α, β at the same time. As mentioned above, where the value of a gain α is varied with a gain β taken to have a value of zero, then the quality Q of the circuit of FIG. 3 is prominently elevated when the frequency characteristics of sound signals are brought to an attenuated state. Further, where the value of a gain β is varied with a gain α taken to have a value of zero, then the quality Q of the circuit of FIG. 3 is considerably improved when the frequency characteristics of sound signals are brought to an emphasized state.

Where, therefore, gains α, β are varied at the same time, then overlapping takes place between the conditions in which Q is increased by variation of the gain β, for example, in an emphasized state, and the conditions in which Q is decreased by variation of the gain α similarly in an emphasized state. As the result, the frequency characteristics-controlling device of this invention provides a proper quality Q under an emphasized state due to said overlapping.

Where the particular frequency $f_0$ derived from the circuit of FIG. 3 has a value of $f_0=1/2\pi Cr$, then the quality Q of said circuit can be made to vary with gains α, β, while the level of the overall gain G is fixed. Thus under the emphasized condition shown, for example, in FIG. 10, it is possible to vary Q over a broad range from curve 91 representing increased Q to curve 92 denoting decreased Q. The above-mentioned procedure can noticeably change tone quality by varying gains from $\alpha=0$ (maximum Q) to $\beta=0$ (minimum Q) without changing the level of the overall gain G.

Since the level of output sound signals at the particular frequency $f_0$ and Q constitute such factors as provide different tone effects, these factors should be varied independently in order to obtain a desired tone effect generally by variation of tone quality. This invention can provide a frequency characteristics-controlling device capable of fully meeting such demand. Though FIG. 10 only indicates the emphasized condition of the frequency characteristics of sound signals, yet this invention can also considerably vary Q with the level of the overall gain G fixed even under the attenuated condition of sound signal frequency.

While the impedance elements 27, 30 of the bridged-T circuit of FIG. 3 were constituted by resistance and the impedance elements 28, 29 by capacitance, this invention can be practiced with the same effect by causing, as shown in FIG. 11, the impedance elements 27, 30 to be formed of capacitance and the impedance elements 28, 29 of resistance. In the latter case, too, tone quality can be altered over a broad range by changing the value of Q by variation of the gains $\alpha, \beta$ without changing the level of the overall gain G.

Referring back to the circuit of FIG. 6, in case of $\beta \ll 1$, namely, $$\beta = - \frac{(C1 + C2)R2}{C1R1},$$

then $G=\infty$, thus causing said circuit to commence oscillation. Where, therefore, the value of a gain $\beta$ is varied within the range free from oscillation, then the value of Q can be changed from a prescribed level under the attenuated condition to a prescribed level under the emphasized condition.

Referring to FIG. 8, where a gain $\alpha$ is made to have the following value $$\alpha = 1 + \frac{(C1 + C2) R2}{C1R1}$$

then the overall gain G is brought to zero. Since, under this condition, output at the particular frequency $f_0$ has a zero level with respect to a prescribed input, the circuit of FIG. 8 can be used as a filter for providing very sharp attenuation characteristics.

FIG. 12 presents the circuit arrangement of a frequency characteristics-controlling device according to another embodiment of this invention. The gain-controlling circuit for controlling gains $\alpha, \beta$ consists of variable resistors 101, 102. An output signal from the gain-controlling variable resistor 101 is supplied to the noninversion input terminal 104 of an operational amplifier 103 having an infinite input impedance and a zero output impedance, and an output signal from the gain-controlling variable resistor 102 is delivered to the inversion input terminal 105 of said amplifier 103. Output from said amplifier 103 is fed back to the inversion input terminal 105 through a resistor 106 and also conducted to the common terminal 108 of a bridged-T circuit 107. The operational amplifier 103 is of a differential type.

The common terminal 108 of the bridged-T circuit 107 of FIG. 12 is connected to one gain-controlling resistor 102 through the resistor 106. Where, therefore, a gain $\beta$ is varied, then the resistance of the resistor R2 of the impedance element 30 included in said bridged-T circuit 107 is substantially changed. Though, therefore, the resistance R2 is connected through the terminal 108 to the output terminal of the operational amplifier 103 having a zero output impedance, the particular frequency $f_0$ remains unchanged.

FIG. 13 sets forth the circuit arrangement of a frequency characteristics-controlling device according to a further embodiment of this invention, wherein the variable resistor 102 of FIG. 12 is replaced by a variable capacitor 110. This arrangement enables the particular frequency derived from the circuit of FIG. 13 to be varied by changing the value of the resistor 106 or capacitor 110.

Now, let the voltage at the terminal 104 of FIG. 13 be designated as e1, the voltage at the terminal 111 as $e3$ and the voltage on the signal receiving side of the capacitor 110 as eo. Then the following equation results:

$$e3 = (1 + j\omega C1R3)e1 - j\omega C1R3 eo \quad \ldots \quad (8)$$

where
$e1 = \alpha ei$, and $e3 = \alpha e1 - \beta eo$.
Therefore
$\alpha = r(1 + j\omega C1R3)$
$\beta = j\omega C1R3$ In this case, the overall gain G of the circuit of FIG. 13 may be expressed as follows:

$$G = \frac{eo}{ei} = \frac{1 - \omega^2 C^2 r^2 + j\omega Cr \left(2K + \frac{1-\alpha}{K}\right)}{1 - \omega^2 C^2 r^2 + j\omega Cr \left(2K - \frac{\beta}{K}\right)} \quad (9)$$

$$= \frac{1 - \omega^2 C^2 r^2 + j\omega Cr \left(2K - \frac{jr\omega C1R3 + r - 1}{K}\right)}{1 - \omega^2 C^2 r^2 + j\omega Cr \left(2K - \frac{j\omega C1R3}{K}\right)}$$

$$= \frac{1 - \omega^2 C^2 r^2 \left[1 - \left(\frac{C1R3\ r}{CrK}\right)\right] + j\omega Cr \left(2K - \frac{r-1}{K}\right)}{1 - \omega^2 C^2 r^2 \left(1 - \frac{C1R3}{CrK}\right) + 2jK\omega Cr} \quad (10)$$

A frequency at which the overall gain of output voltage eo corresponding to input voltage ei has a maximum or minimum value can be obtained from the equation (10) above by determining such value of $\omega$ as satisfies the following equation:

$$1 - \omega^2 C^2 r^2 \left[1 - \left(\frac{C1R3r}{CrK}\right)\right] = 0 \quad (11)$$

In case of $K = 1$ and $\alpha = 3$ (attenuated condition), then the equation (11) may be rewritten as follows:

$$1 - \omega^2 C^2 r^2 \left[1 - 3 \cdot \left(\frac{C1R3}{CrK}\right)\right] = 0 \quad (12)$$

Thus $$\omega = \frac{1}{\sqrt{1 - 3 \cdot \frac{C1R3}{Cr}} \cdot Cr} \quad (13)$$

In this case, the overall gain G of the circuit of FIG. 13 may be expressed as follows:

$$G = 1 - \frac{\alpha-1}{2K^2} = \frac{2K^2-\alpha+1}{2K^2} \tag{14}$$

Since K=1, the overall gain G has a value of zero.

The overall gain G in a lower frequency region than the prescribed frequency at which G≈0 is attained has a value of G≈1 and, in a higher frequency region than said prescribed frequency, has a value expressed as follows:

$$G \approx \frac{1 - \frac{C1R3K}{CrK}}{1 - \frac{C1R3}{CrK}} = \frac{CrK - C1R3K}{CrK - C1R3} \tag{15}$$

Namely, the prescribed frequency ω can be varied by changing the value of the resistor R3 and/or capacitor C1 included in the equation (13). While the foregoing description refers to the case of α > 1, ω can also be changed in the case of α < 1.

According to the circuit arrangement of FIG. 13, output voltage eo from said circuit is impressed on the inversion input terminal 105 of operational amplifier 103 through the variable capacitor 110. However, as shown in FIG. 14, the same effect can be obtained by supplying the input voltage ei of said circuit to the inversion input terminal 105 through the variable capacitor 110 and impressing output voltage eo on the noninversion input terminal 104 through the gain-controlling circuit 24.

As mentioned above, this invention provides a frequency characteristics-controlling device of high reliability which not only varies tone quality over a very broad range but also can be rendered compact with simple arrangement, because the inductance elements are not used in the bridged-T circuit which consists of resistance and capacitance alone.

What is claimed is:

1. A frequency characteristics-controlling device which comprises a first operational amplifier provided with inversion and noninversion input terminals; a bridged-T circuit provided with a common terminal and connected between the inversion input terminal and output terminal of the first operational amplifier; first means for connecting the noninversion input terminal of the first operational amplifier and the common terminal of the bridged-T circuit; second means for connecting output terminal of the first operational amplifier and the common terminal of the bridged-T circuit; and a gain-controlling circuit included in at least one of said first and second connecting means.

2. A frequency characteristics-controlling device according to claim 1 wherein the bridged-T circuit comprises a first resistor connected between the inversion input terminal and output terminal of the first operational amplifier; a series circuit formed of first and second capacitors and connected in parallel to the first resistor; and a second resistor connected between the junction of the first and second capacitors and the common terminal of the bridged-T circuit.

3. A frequency characteristics-controlling device according to claim 1 wherein the bridged-T circuit comprises a first capacitor connected between the inversion input terminal and output terminal of the first operational amplifier; a series circuit formed of first and second resistors and connected in parallel to the first capacitor; and a second capacitor connected between the junction of the first and second resistors and the common terminal of the bridged-T circuit.

4. A frequency characteristics-controlling device according to claim 1 wherein the gain-controlling means comprises a variable resistor provided with a variable terminal and connected to one of the noninversion input terminal and output terminal of the first operational amplifier; and a transistor, the base of which is connected to the variable terminal, and the emitter of which is connected to the common terminal of the bridged-T circuit.

5. A frequency characteristics-controlling device according to claim 1 wherein the gain-controlling means comprises a first transistor, the base of which is connected to one of the noninversion input terminal and output terminal of the first operational amplifier; a variable resistor provided with a variable terminal and connected between the collector and emitter of the first transistor; a second transistor, the base of which is connected to the variable terminal; an amplifier provided with a third transistor for amplifying output from the second transistor; and means for supplying output from the last-mentioned amplifier to the common terminal of the bridged-T circuit.

6. A frequency characteristics-controlling device according to claim 1 wherein the gain-controlling means is a variable resistor.

7. A frequency characteristics-controlling device according to claim 1 which comprises a first gain-controlling variable resistor, one end of which is connected to the noninversion input terminal of the first operational amplifier; a second gain-controlling variable resistor, one end of which is connected to the output terminal of the first operational amplifier; a second operational amplifier, the noninversion input terminal of which is connected to the other end of the first variable resistor, the inversion input terminal of which is connected to the other end of the second variable resistor, and the output terminal of which is connected to the common terminal of the bridged-T circuit; and a resistor connected between the inversion input terminal and output terminal of the second operational amplifier.

8. A frequency characteristics-controlling device according to claim 1 which comprises first gain-controlling means, the input terminal of which is connected to the noninversion input terminal of the first operational amplifier; a variable capacitor acting as second gain-controlling means, one end of said variable capacitor being connected to the output terminal of the first operational amplifier; a second operational amplifier, the noninversion input terminal of which is connected to the output terminal of the first gain-controlling means, the inversion input terminal of which is connected to the other end of the variable capacitor and the output terminal of which is connected to the common terminal of the bridged-T circuit; and a resistor connected between the inversion input terminal and output terminal of the second operational amplifier.

9. A frequency characteristics-controlling device according to claim 1 which comprises first gain-controlling means, the input terminal of which is connected to the output terminal of the first operational amplifier; a variable capacitor acting as second gain-controlling means, one end of the variable capacitor being connected to the noninversion input terminal of said first operational amplifier; a second operational amplifier, the inversion input terminal of which is connected to the output terminal of the first gain-controlling means, the noninversion input terminal of which is connected to the other end of the variable capacitor and the output terminal of which is connected to the common terminal of the bridged-T circuit; and a resistor connected between the inversion input terminal of the second operational amplifier and the output terminal thereof.

* * * * *